(12) United States Patent
Elhami Khorasani et al.

(10) Patent No.: US 10,700,057 B1
(45) Date of Patent: Jun. 30, 2020

(54) DOUBLE-INTEGRATED SILICON CONTROL RECTIFIER TRANSISTOR AND RELATED METHODS

(71) Applicant: SEMICONDUCTOR COMPONENTS INDUSTRIES, LLC, Phoenix, AZ (US)

(72) Inventors: Arash Elhami Khorasani, Phoenix, AZ (US); Mark Griswold, Gilbert, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 15 days.

(21) Appl. No.: 16/245,913

(22) Filed: Jan. 11, 2019

(51) Int. Cl.
| | |
|---|---|
| H01L 27/02 | (2006.01) |
| H01L 29/10 | (2006.01) |
| H01L 29/808 | (2006.01) |
| H01L 23/60 | (2006.01) |

(52) U.S. Cl.
CPC ......... *H01L 27/0262* (2013.01); *H01L 23/60* (2013.01); *H01L 27/0266* (2013.01); *H01L 29/1066* (2013.01); *H01L 29/808* (2013.01)

(58) Field of Classification Search
CPC ....... H01L 23/60; H01L 27/0248–0296; H01L 29/808; H01L 29/8086; H01L 29/8126; H01L 29/1066; H01L 29/812
See application file for complete search history.

(56) References Cited

U.S. PATENT DOCUMENTS

| | | | | |
|---|---|---|---|---|
| 8,253,165 | B2* | 8/2012 | Wang | H01L 27/0251 257/173 |
| 8,786,021 | B2* | 7/2014 | Chan | H01L 27/0629 257/355 |
| 10,319,713 | B2* | 6/2019 | Chiu | H01L 27/0288 |
| 2017/0077083 | A1 | 3/2017 | Fujiwara et al. | |

OTHER PUBLICATIONS

S. Pendharkar et al., "SCR-LDMOS—A Novel LDMOS Device with ESD Robustness", ISPSD 2000, pp. 341-344.
J-R Tsai et al, "Development of ESD Robustness Enhancement of a Novel 800V LDMOS Multiple RESURF with Linear P-top Rings," IEEE TENCON 2011, pp. 760-763.
S. Fujiwara et al., "Source Engineering for ESD Robust NLDMOS", EOS/ESD Symposium 2011, pp. 53-58.

* cited by examiner

*Primary Examiner* — Jose R Diaz
(74) *Attorney, Agent, or Firm* — Chamberlain Hrdlicka

(57) ABSTRACT

The disclosed embodiments include an ESD robust transistor with a compound-SCR protection. The transistor may include a semiconductor substrate having a first conductivity type, a drain region coupled with the semiconductor substrate having a drain SCR component with a first drain region of the first conductivity type and a second drain region of the second conductivity type. The transistor may also include a source coupled with the semiconductor substrate, a channel region of the second conductivity type, and a gate coupled with the channel region having SCR components with a first gate region of the first conductivity type and a second gate region of the second conductivity type. The drain SCR components and the gate SCR components may create a low resistance discharge path along the channel region that activates in response to the ESD such that the ESD discharges through the transistor without causing damage to the transistor.

20 Claims, 4 Drawing Sheets

DOUBLE-INTEGRATED SILICON CONTROL RECTIFIER TRANSISTOR AND RELATED METHODS

BACKGROUND

Semiconductor transistors may be subject to damage or altered behavior due to electrostatic discharge (ESD). ESD causes damage when charge builds up on a body (e.g., human body, machine, packaging container, etc.) which then comes in contact with the semiconductor transistor. If the charge that is built up on the body discharges into the semiconductor transistor, it can lead to a large and sudden burst of current flowing into the device. This current may undergo filamentation, which can melt the metal, contacts, and the semiconductor material as the power dissipates in the form of thermal energy. The melted location can cause the device to fail.

There are a variety of models/standards that are used for designing and testing against transistor failure due to electrostatic discharge. These include the human body model (HBM), the charge device model (CDM) and the machine model (MM). The HBM simulates ESD due to discharge from a human being. The CDM simulates a charged device's discharge when it contacts a conductor. The MM simulates discharge from a non-human source to the device, such as from production equipment or a tool. These models/standards provide a metric for designating the voltage that the device is likely to withstand without damage.

Semiconductor transistors may include shielding or other dissipative components to prevent the ESD from causing damage. These techniques, however, often require additional steps in the fabrication process or an adjustment to the design of the semiconductor transistor that complicate the design and fabrication process.

DETAILED DESCRIPTION

Figure 1:
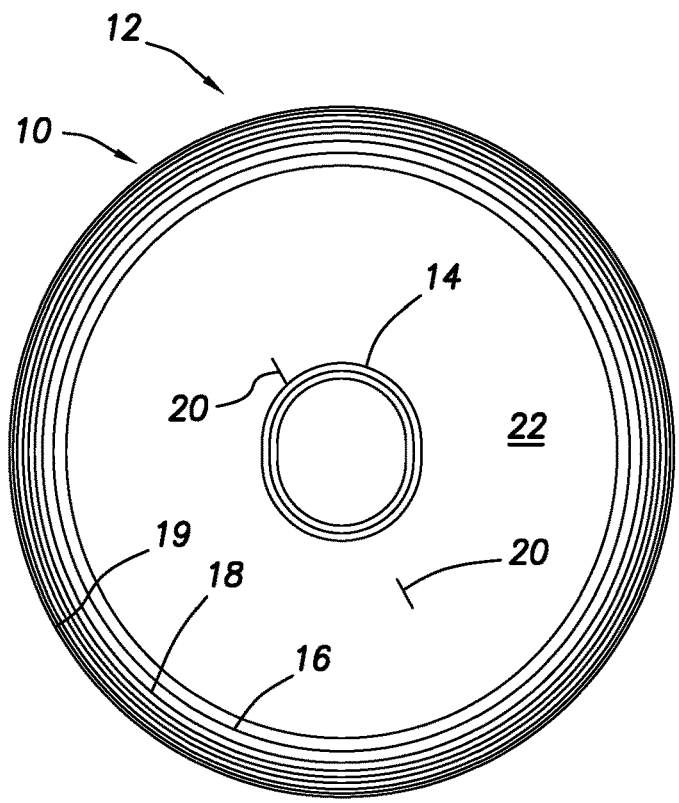
FIG. 1 is a top view of an embodiment of a semiconductor device on a semiconductor wafer.

The present invention relates, in general, to electronics and, more particularly, to semiconductor device structures and methods of forming semiconductor devices.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of a transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

Silicon controlled rectifiers (SCR) are layered power controlling devices that activate or trigger to enable current to flow along a discharge flow path. At certain (i.e., low) voltage and/or current levels the SCR is electrically absent, allowing current and/or voltage to flow or be applied without effect. At other voltages or currents, however, the SCR "activates," meaning that the resistance in the flow path containing the SCR drops. The drop in resistance of the flow path enables any buildup of charge (i.e., during an ESD event) to quickly dissipate through the flow path. The flow paths in the embodiments described below may also be termed a discharge path, which is a path created by the SCR for flow of the current of the ESD.

The present description includes, among other features, a compound-SCR architecture that is made up of an SCR anode at the drain region of a semiconductor transistor, with the first SCR cathode and first SCR gate being located at the gate region of the semiconductor transistor, and a second alternative or additional SCR cathode and second SCR gate at the body region of the semiconductor transistor, or both. These SCR components are added to the structure without otherwise changing the architecture or parametric behavior of the transistor. The compound-SCR includes a single architecture having two coexisting SCR devices that share a common anode terminal. One or more of these SCR devices lower resistance of the semiconductor transistor during an ESD event, which decreases the risk of damage and/or defects occurring during the ESD event.

Turning now to the figures, FIG. 1 is a top view of an embodiment of a semiconductor device 10 on a semiconductor wafer 12. The semiconductor wafer 12 may include many semiconductor devices 10 over the whole of the surface. The semiconductor device 10 may be a junction gate field-effect transistor (JFET) having a drain region 14, gate region 16, source region 18, and body region 19. As shown, the device 10 may be stadium-shaped, but the device 10 may also include other closed shapes, such as circular, horseshoe, elliptical, or rectangular transistors. During an ESD event, an amount of energy has to dissipate through the device 10 in a short period of time. This dissipation of energy can cause the device to have altered electrical behavior. For example, the device 10 may have increased leakage current, and may be manifested by microscopic damage spots along the ESD surge current conduction path 20. As indicated above, there are a number of sources of charge that cause the ESD, including contact with a human body, discharge of a charged device itself, or discharge from a tool or production implement that comes into contact with the device 10. The damaged spots 20 may include filament-like failure spots on the surface or inside of a channel region 22 or deeper into the semiconductor wafer 12, for example. As discussed above, the damaged spots 20 can lead to undesirable transistor operation.

Figure 2:
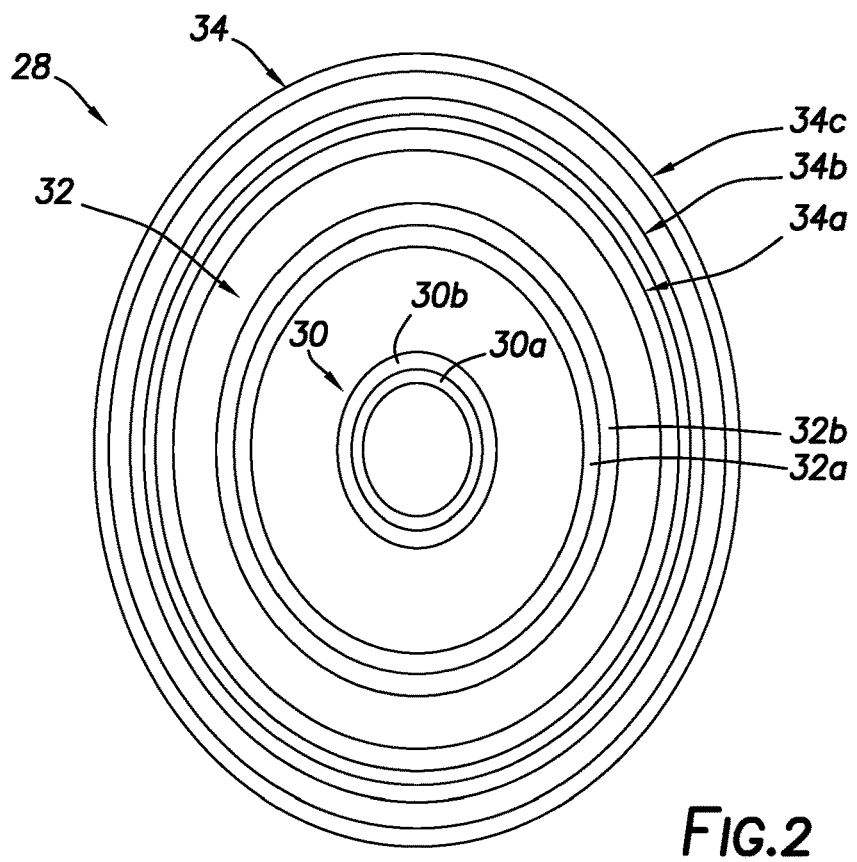
FIG. 2 is a schematic view of an embodiment of the device of FIG. 1.

FIG. 2 is a schematic view of an embodiment of the device 10 of FIG. 1, showing internal portions of the drain region 14, gate region 16, and body region 19 that are most pertinent to certain embodiments of the invention. Specifically, the schematic shows the separate SCR components of the architecture of a compound-SCR 28: a drain component 30, a gate component 32, and a body component 34 that raise a threshold such that ESD damage to the device 10 is prevented when the charge of an ESD event is below the threshold. For example, the threshold for an 800 V JFET having the compound-SCR 28 architecture may be raised to an HBM rating of 4.0 kV. In certain embodiments, a JFET may include a rated operating voltage between 200 V and 1500 V. These embodiments may also have an HBM rating of 4.0 kV. The SCR components 30, 32, 34 of the compound-SCR 28 architecture are layers beneath the surface of the device 10, and thus are not visible externally (i.e., in the top view of FIG. 1). The embedded layers of the SCR components 30, 32, 34 are also located in areas that do not affect the operation of the semiconductor device 10. Furthermore, fabrication of the SCR components 30, 32, 34 occurs by adjusting the location and/or duration of steps that are already present in the fabrication of the semiconductor device 10. Thus, the compound-SCR 28 protects against an ESD event without adding significant cost to design or fabrication processes.

The drain component 30 of the compound-SCR 28 includes a first region 30a of a first conductivity type and a second region 30b of a second conductivity type. The ratio between lateral extension of regions 30a/30b may be of certain value so that optimum SCR activation behavior and ESD protection is achieved. Similarly, the gate segment 32 of the compound-SCR 28 includes a first region 32a of a first conductivity type and a second region 32b of a second conductivity type. The body segment 34 of the compound-SCR 28 includes a first region 34a of the second conductivity type and a second region 34b of the first conductivity type and a third region 34c of the second conductivity type.

Figure 3:
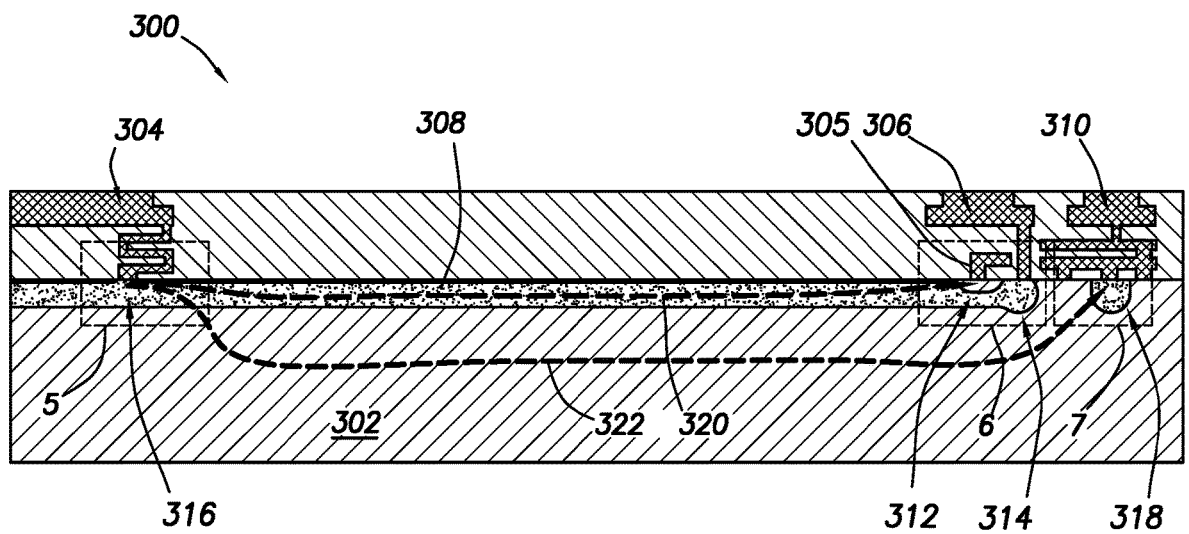
FIG. 3 is a cross-sectional side view illustrating an embodiment of a semiconductor transistor.

FIG. 3 is a cross-sectional side view of an embodiment of a transistor 300. The transistor 300 includes a semiconductor substrate 302. In the implementation shown the substrate is a P type (p-doped) substrate, though in other implementations other configurations (such as an N type (n-doped) substrate) could be used. Thus, in the implementation shown the gate/channel/substrate forms a PNP configuration, though in other implementations this could be configured so that an NPN configuration is formed.

The configuration (P type, N type, etc.) of the semiconductor substrate may be manufactured using any number of doping, diffusion, and/or annealing steps, or the like, with a silicon substrate, by non-limiting example. As will be described below, the transistor 300 further includes drain regions, gate regions, source regions, substrate contact regions, or other regions, each of which may have different electrical and/or other properties. The different regions may be formed by any number or combination of masking (photoresist), exposing, etching, washing, doping, implanting, diffusing, annealing, and/or other steps, using appropriate materials, dopants, and other appropriate materials.

The transistor 300 includes drain terminal 304, gate terminal 305, channel region 308, source terminal 306, and body terminal 310. The terminals 304, 305, 306, and 310, in operation, may be connected to power contacts that supply or convey electrical current to the transistor 300. The channel region 308 may be an N− channel region. A gate region 312, source region 314, and drain region 316, and body region 318 are all coupled with (and, in the implementations shown, are in direct contact with) the channel region 308, thus electrical current may flow between the source terminal 306 and drain terminal 304 through the channel region 308 and may be controlled by the gate terminal 305. Each of the drain region 316 (comprising an SCR component), the gate region 312 (comprising an SCR component), and the body region 310 (comprising an SCR component), are described in detail in FIGS. 5, 6, and 7, respectively as labeled in FIG. 3.

During an ESD event, the components of the compound-SCR (e.g., compound-SCR 28) work together as a single structure to dissipate and/or direct the energy from the ESD event through the transistor 300 without damage (e.g., damage spots 20 from FIG. 1). The transistor 300 includes a channel flow path 320 and a substrate flow path 322 that convey the energy from ESD event through the transistor 300. That is, when the ESD event sharply and drastically increases the voltage across the SCR devices, the resistance along the channel flow path 320 and the substrate flow path 322 is lowered, thereby quickly dissipating the charge of the ESD.

Figure 4:
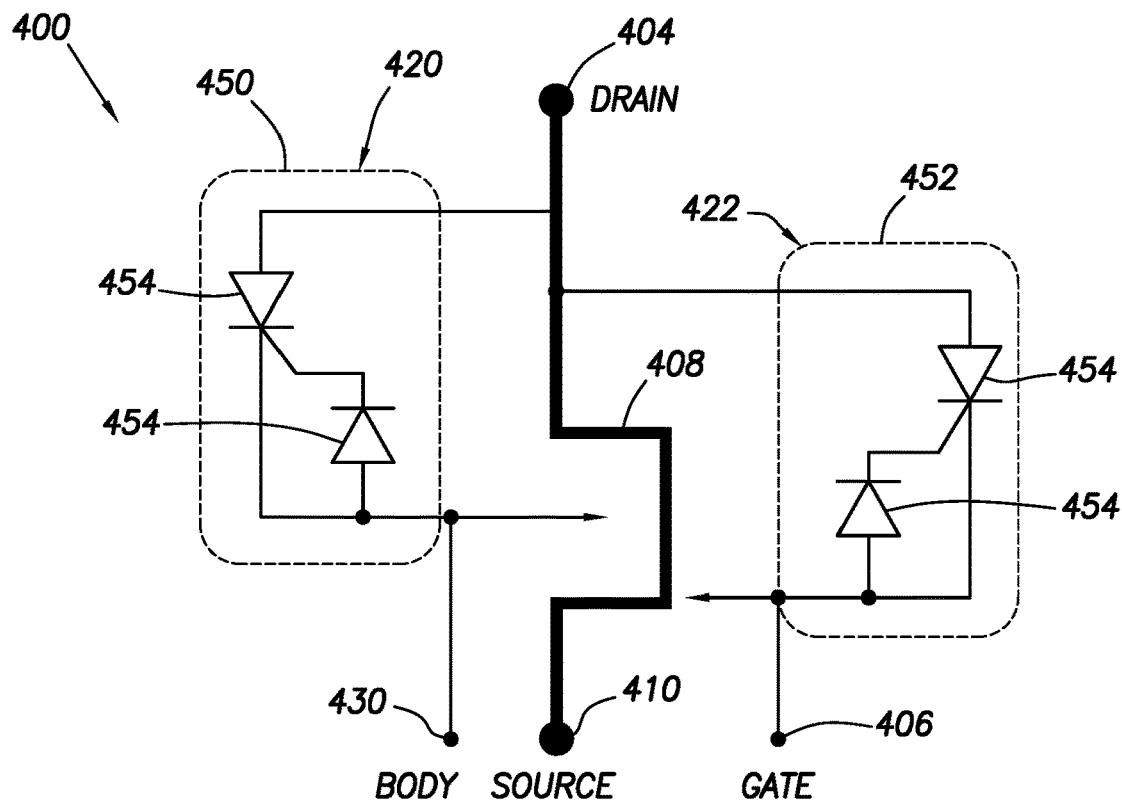
FIG. 4 is a diagrammatical view illustrating an embodiment of an SCR circuit for discharging ESD through the semiconductor transistor.

The ESD discharge paths (i.e., channel discharge path 320 and substrate discharge path 322) are schematically represented in FIG. 4, which illustrates an embodiment of a transistor 400. The transistor 400 has a drain terminal 404, a gate terminal 406, a channel 408, a source terminal 410, and a body terminal 430. The operation of the transistor 400 has current through the channel 408 between the source 410 and the drain 404. As mentioned before, the compound-SCR (e.g., compound-SCR 28) includes two cooperative sets of back-to-back SCR devices 454 that share some components. From equivalent circuit standpoint, the transistor 400 includes a first SCR device 450 that enables a first flow path 420, and a second SCR device 452 that enables a second flow path 422. Each SCR device has the potential to "activate" when a high-voltage pulse (i.e., ESD event) is applied to the transistor 400. That is, when the SCR devices 450, 452 activate, the resistance along the first flow path 420 and the second flow path 422 drops significantly. This drop in resistance not only lowers the power that is dissipated in the transistor but also facilitates a faster dissipation of the power from the ESD event, and decreases the likelihood of damage to the transistor 400 by reducing the likelihood of filamentation and localized self-heating. Every direction (i.e., radial directions out from the centralized drain region 14) through the flow paths 420, 422 has a low resistance, and therefore the ESD has no impetus to concentrate the electricity through a single filament. The first flow path 420 and the second flow path 422 share a common anode with a drain region located proximate the drain terminal 404 as described above.

Figure 5:
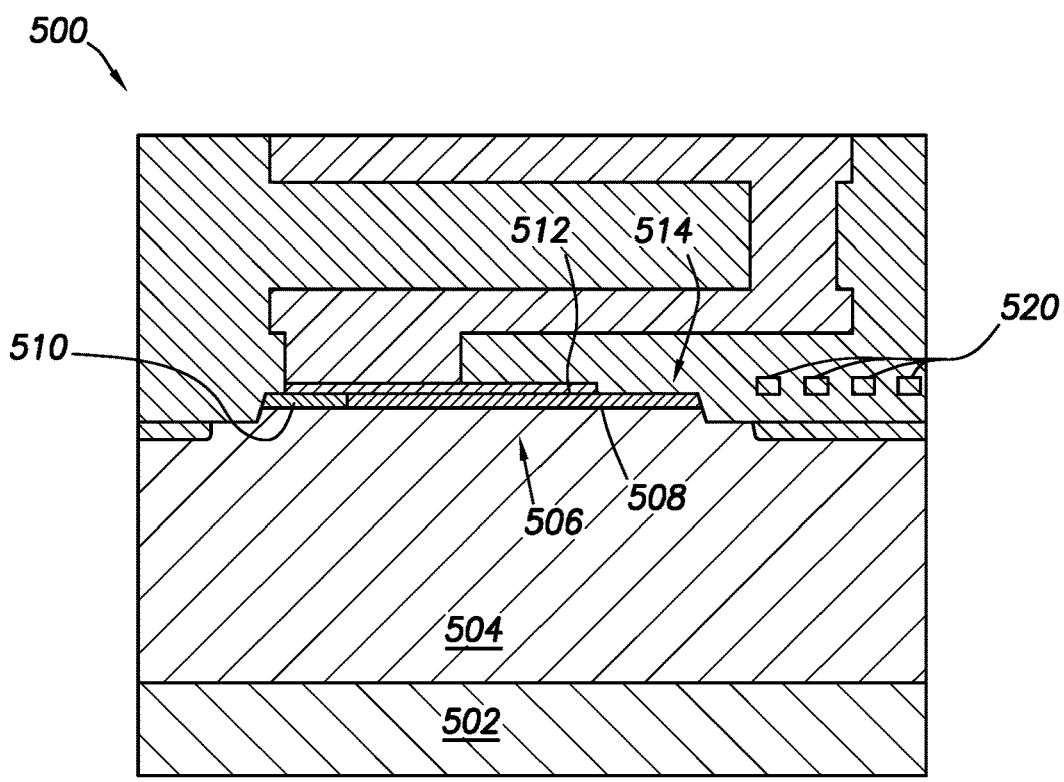
FIG. 5 is an enlarged partial cross-sectional view illustrating an embodiment of a drain region of an ESD robust semiconductor transistor.

FIG. 5 is a diagrammatical cross-section view of an embodiment of a drain region 500 (e.g., drain region 316 of FIG. 3, but not necessarily limited to the embodiment of FIG. 3) of an ESD robust semiconductor transistor with compound-SCR (e.g., transistor 300). The drain region 500 is coupled with a channel region 504 of a first conductivity type above a substrate 502. An SCR component 506, as illustrated, may include a P+ region (P+ anode) 508 and an N+ region 510. A conducting electrode 512 is laid over these two regions 508, 510 and may be fabricated as an electrically conductive silicide, though in other implementations it could be formed of salicizing a layer of silicon, or may be formed using a metal or another electrically conductive element. The conducting electrode 512 may not always fully cover the P+ region 508. Instead, a gap is left, which forms and/or becomes a resistive electrical ballast region (separation layer) 514. This resistive electrical ballast region 514 greatly enhances the ESD robustness of the transistor. As indicated to some extent above, the resistive electrical ballast regions are buffer regions or layers between the gate/source and the drain and help to increase the robustness of the device to damage from ESD.

Although the various regions in the representative example are formed of particular material types, i.e., a P type substrate, N+ source region, P+ gate region, P+ substrate contact region, P+ drain region (P+ anode), N+ drain region, N− channel region, silicide region, and so forth, other material types and combinations could be chosen by the practitioner of ordinary skill having similar or different electrical or other properties as desired (for instance beginning with an N type substrate and choosing the other material types accordingly). The P+ region 508 and the N+ region 510 in the drain region 500 may comprise materials and/or doping that is present in the fabrication process of an otherwise finished design of a transistor. For example, the drain region 500 may be located adjacent to a polysilicon resistor field plate 520. The field plate 520 may be designed with a certain configuration that creates a desired field with the transistor (e.g., transistor 300). In the embodiment illustrated in FIG. 5, the field plate 520 comprises a flat spiral that shows up in the cross-section as individualized points. The spiral resistor field plate 520 may be connected on one end to a drain terminal, and to the ground on the other end. Other configurations may be used by other circuit designs. The drain SCR components 506, however, take up so little space within the drain region 500, that the design of the remainder of the circuit/transistor is almost entirely unaffected.

Figure 6:
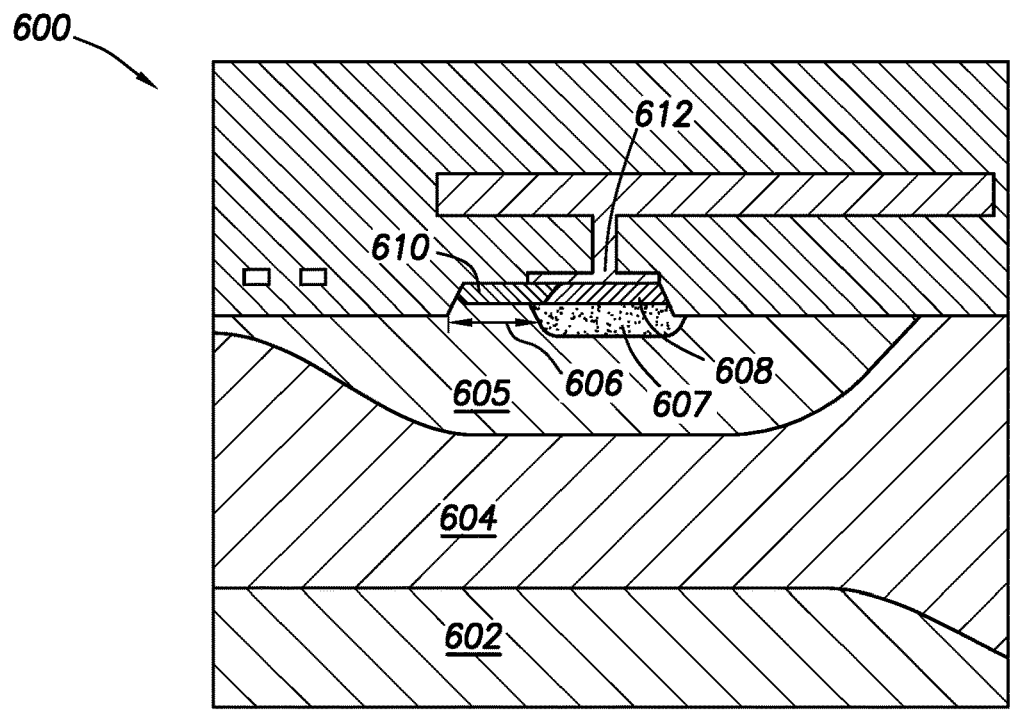
FIG. 6 is an enlarged partial cross-sectional view illustrating an embodiment of a gate region of an ESD robust semiconductor transistor.

FIG. 6 is a diagrammatical cross-section view of an embodiment of a gate region 600 (e.g., gate region 312 of FIG. 3, but not necessarily limited to the embodiment of FIG. 3) of a ESD robust semiconductor transistor with compound-SCR (e.g., transistor 300). The gate region 600 is coupled with an N− channel region 604 above a substrate 602. The gate region 600 may include a shallow p-well region 607, and a deep p-well 605 that along with the channel region act as reverse biased junction that control the current flow in transistor's channel during transistor's normal operation. The deep p-well 605 may be less heavily doped than the shallow p-well 607. SCR components, as illustrated, may be embedded above the shallow p-well 607 and include a P+ region 608 and an N+ region 610. In certain embodiments, an conducting electrode 612 is laid over these two P+ and N+ layers 608, 610 in the gate region 600. The conducting electrode 612, as with the drain conducting electrode 612, may include an electrically conductive silicide region, though in other implementations it could be formed of a metal or another electrically conductive element. The conducting electrode 612 may be coupled to electrical leads that are used to electrically couple the gate region 600 with an external element or some other device.

The shallow p-well 607, in certain embodiments, may extend only partially under the SCR components 608, 610. Specifically, the shallow p-well 607 may be pulled back a distance 606 that may be tuned to be a certain value in order to create the resistance along SCR flow path (e.g., flow path 320 in FIG. 3) so that SCR triggering can happen. Additionally or alternatively, the conducting electrode 612 may not fully cover the N+ region 610. The gate region 600, as with the drain region 500, may be located adjacent to other transistor components that are shaped and located as part of a specific transistor design. The SCR components 608, 610 take up so little space within the gate region 600, that the design of the remainder of the circuit/transistor is almost entirely unaffected.

Figure 7:
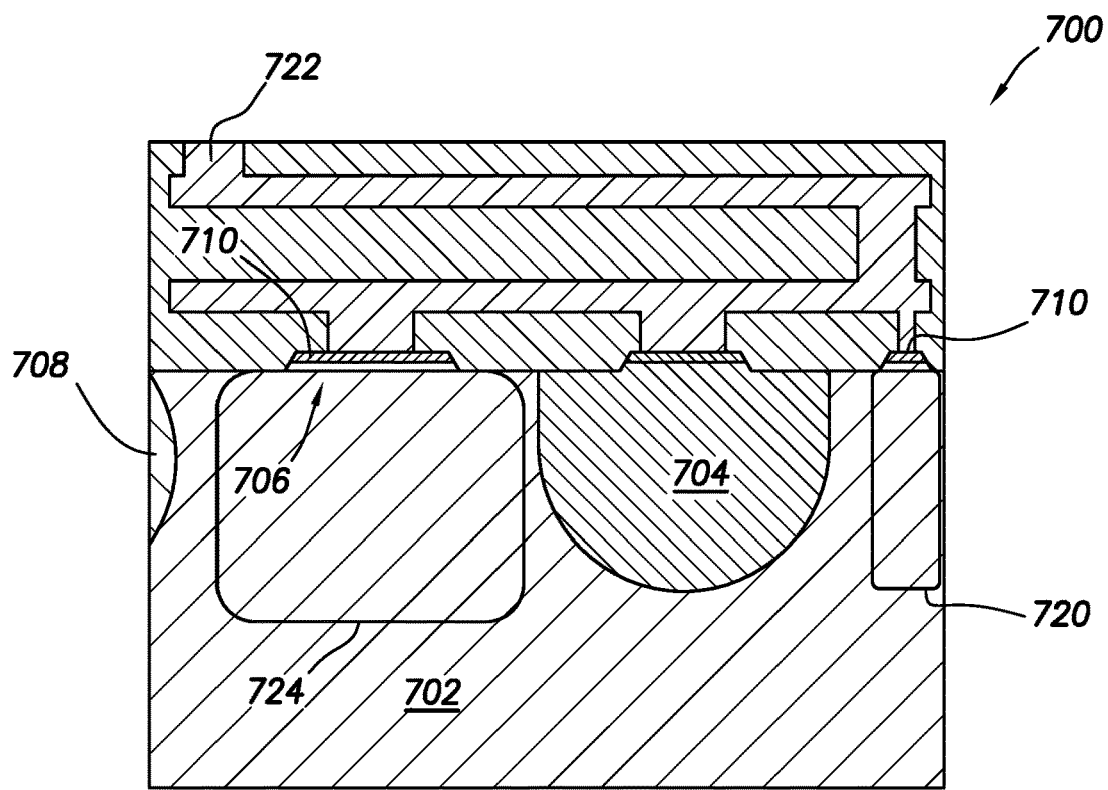
FIG. 7 is an enlarged partial cross-sectional view illustrating an embodiment of a body region of an ESD robust semiconductor transistor.

FIG. 7 is a diagrammatical cross-section view of an embodiment of a body region 700 of an ESD robust semiconductor transistor (e.g., transistor 300). The body region 700 includes two p-well regions 720, 724 and an n-well region 704. In normal operation, the body region 700 provides a reference potential (which in some applications might be zero volts) to the substrate 702 through the p-wells 720, 724. During an ESD event, however, the one or both of the p-wells (720, 724) acts as an SCR gate that activates an SCR to enable the ESD energy current to flow from the transistor's drain terminal to its body terminal (e.g., through an ESD discharge path 322). In some applications, the three P and N regions may be electrically connected together via a metal layer on top. Alternatively, either the left p-well region 724 or the right p-well region alone may be electrically shorted to N region. The left p-well 724 may also prevent punch-through between the transistor's source n-region 708 and SCR's n-well component 704 during the normal operation of the transistor.

As described above, this combination of layers greatly enhances the ESD robustness of the transistor (e.g., transistor 300) when combined with the SCR components described in FIG. 5 and FIG. 6. As described above, this combination of layers (i.e., gate regions 607, 608, 610, and conducting electrode 612, and body regions 720, 724, 704) enhances the ESD robustness of the transistor (e.g., transistor 300) when combined with the SCR components 506 described above. For example, an embodiment of the transistor (e.g., transistor 300) may increase a ESD rating from 1.5 kV HBM to 4.0 kV HBM by including a compound-SCR having a drain SCR component (e.g., 506) with either a gate SCR component (e.g., gate SCR 606) or a body SCR component (e.g., 706).

The components described above may be provided as steps in a fabrication process. For example, the semiconductor substrate may be provided as a wafer, and may be doped to include a conductivity type (i.e., P type or N type doping). The SCR devices may be provided by layering and etching semiconductor materials such as doped silicon. While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. An ESD robust transistor with a compound-SCR protection, comprising:
   a semiconductor substrate comprising a first conductivity type;
   a drain region coupled with the semiconductor substrate comprising a drain SCR component comprising a first drain region of the first conductivity type and a second drain region of the second conductivity type;
   a source coupled with the semiconductor substrate;
   a channel region of the second conductivity type;
   a gate coupled with the channel region comprising SCR components comprising a first gate region of the first conductivity type and a second gate region of the second conductivity type; and
   wherein the drain SCR components and the gate SCR components create a low resistance discharge path along the channel region that activates in response to the ESD such that the ESD discharges through the transistor without causing damage to the transistor.

2. The transistor of claim 1, comprising a body coupled with the semiconductor substrate and comprising body SCR components comprising a first body region of the first conductivity type, a second body region of the second conductivity type.

3. The transistor of claim 2, wherein the drain SCR components and the body SCR components create a low resistance discharge path along the substrate that activates in response to the ESD such that the ESD discharges through the transistor without causing damage to the transistor.

4. The transistor of claim 2, wherein the drain SCR components are a common anode for the low resistance discharge path along the channel region and a low resistance discharge path along the substrate.

5. The transistor of claim 2, comprising a third body region of the first conductivity type.

6. The transistor of claim 5, comprising a metal layer on top of two or more of the first body region, the second body region, and the third body region.

7. The transistor of claim 1, comprising a conducting electrode over the drain region and wherein the conducting electrode covers a portion of the first drain region and a portion of the second drain region without covering all of the second region.

8. The transistor of claim 1, comprising a conducting electrode over the gate region and wherein the conducting electrode covers a portion of the first gate region and a portion of the second gate region without covering all of the second region.

9. The transistor of claim 1, comprising a resistor field plate located above the channel region.

10. The transistor of claim 1, wherein the transistor comprises a stadium shape, a circular shape, an elliptical shape, a horseshoe shape, or a rectangular shape.

11. The transistor of claim 1, wherein the transistor comprises an junction field effect transistor (JFET) having a voltage rating between 200 V and 1500 V.

12. The transistor of claim 1, wherein transistor comprises an electrostatic discharge rating that is greater than 4.0 kV according to the human body model.

13. The transistor of claim 1, wherein the first conductivity type comprises P type conductivity.

14. An ESD robust transistor, comprising:
   a semiconductor substrate of a first conductivity type;
   a drain coupled with the semiconductor substrate comprising drain SCR components;
   a channel region of the second conductivity type;
   a gate coupled with the channel region comprising gate SCR components;
   a body coupled with the semiconductor substrate comprising body SCR components; and
   wherein the drain SCR components are a common anode for a low resistance discharge path along the channel region to the gate SCR components and a low resistance discharge path along the substrate to the body SCR components.

15. The transistor of claim 11, comprising a resistor field plate located above a channel region.

16. The transistor of claim 11, wherein the transistor comprises a junction field effect transistor (JFET) having a voltage rating between 200 V and 1500 V and a shape comprising a stadium shape, a circular shape, an elliptical shape, a horseshoe shape, or a rectangular shape.

17. The transistor of claim 11, wherein the first conductivity type comprises P type conductivity.

18. A method of forming a transistor with compound silicon control rectifier (SCR) comprising:
   providing a semiconductor substrate of a first conductivity type;
   providing a drain coupled with the semiconductor substrate comprising a drain SCR component comprising a first drain region of the first conductivity type and a second drain region of the second conductivity type;
   providing a gate coupled with a semiconductor channel between the drain and a source, wherein the gate comprises a gate SCR component comprising a first gate region of the first conductivity type and a second gate region of the second conductivity type; and
   providing a channel region of the second conductivity type, wherein the drain SCR and the gate SCR lower a resistance of the semiconductor substrate and the channel region in response to the ESD such that the ESD passes through the transistor without damaging the transistor.

19. The method of claim 18, comprising providing a body coupled with the semiconductor substrate comprising a body SCR component comprising a first body region of the first conductivity type and a second body region of the second conductivity type.

20. The method of claim 18, comprising salicidizing a layer of silicon to provide a conducting electrode, wherein the conducting electrode covers all of the second drain region and only part of the first drain region.

* * * * *